(12) United States Patent
Fischer et al.

(10) Patent No.: US 11,088,514 B2
(45) Date of Patent: Aug. 10, 2021

(54) POWER DISTRIBUTOR

(71) Applicant: Ellenberger & Poensgen GmbH, Altdorf (DE)

(72) Inventors: Erich Fischer, Altdorf (DE); Klaus Werner, Roethenbach (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 0 days.

(21) Appl. No.: 15/876,786

(22) Filed: Jan. 22, 2018

(65) Prior Publication Data

US 2018/0145485 A1 May 24, 2018

Related U.S. Application Data

(63) Continuation of application No. PCT/EP2016/061573, filed on May 23, 2016.

(30) Foreign Application Priority Data

Jul. 21, 2015 (DE) .................. 10 2015 213 744.9

(51) Int. Cl.
*H02B 1/052* (2006.01)
*H01R 9/26* (2006.01)
(Continued)

(52) U.S. Cl.
CPC ............... *H02B 1/052* (2013.01); *H01H 9/54* (2013.01); *H01H 71/04* (2013.01); *H01H 71/08* (2013.01);
(Continued)

(58) Field of Classification Search
CPC ............... H02B 1/052; H01R 9/2675
See application file for complete search history.

(56) References Cited

U.S. PATENT DOCUMENTS 4,164,665 A * 8/1979 Berger .................. G05B 19/08
307/141
4,215,386 A * 7/1980 Prager .................. H05K 7/1475
361/679.4
(Continued)

FOREIGN PATENT DOCUMENTS

DE 8618540 U1 9/1986
DE 29611543 U1 9/1996
(Continued)

OTHER PUBLICATIONS

International Preliminary Report on Patentability for International Application No. PCT/EP2016/016573 dated May 23, 2016.
(Continued)

*Primary Examiner* — Mukundbhai G Patel
(74) *Attorney, Agent, or Firm* — Muncy, Geissler, Olds & Lowe, P.C.

(57) ABSTRACT

A power distributor having a plurality of power distribution modules arranged in a row, for directly mounting on a carrier rail, having a supply module arranged on one end face and a signal module arranged on the opposite end face, and having at least one connection module arranged therebetween. The supply module has a supply connection for a main power line for tapping off a supply power. The connection module is fitted or can be fitted with a protective switch that can be actuated and a plurality of load connections for connecting to an interruptible load circuit by means of the protective switch. The signal module has a first signal connection for a switch signal actuating the protective switch, and the power distribution modules are or can be coupled to each other in an electrically conductive manner.

16 Claims, 9 Drawing Sheets

(51) Int. Cl.
  *H01H 9/54* (2006.01)
  *H01H 71/04* (2006.01)
  *H01H 71/08* (2006.01)
  *H01R 13/717* (2006.01)
  *H01R 25/14* (2006.01)

(52) U.S. Cl.
  CPC ....... *H01R 9/2675* (2013.01); *H01R 13/7175* (2013.01); *H01R 25/14* (2013.01); *H01H 71/082* (2013.01); *H01H 2219/036* (2013.01)

(56) References Cited

U.S. PATENT DOCUMENTS

| | | | | |
|---|---|---|---|---|
| 4,738,632 | A | * | 4/1988 | Schmidt ............... H05K 7/1441 361/729 |
| 5,428,769 | A | * | 6/1995 | Glaser ..................... G05B 9/03 700/4 |
| 5,745,338 | A | | 4/1998 | Bartolo et al. |
| 6,371,435 | B1 | | 4/2002 | Landis et al. |
| 7,844,367 | B2 | * | 11/2010 | Nickerson ............... A01G 25/16 700/284 |
| 8,237,311 | B2 | | 8/2012 | Roth |
| 9,055,687 | B2 | * | 6/2015 | Molnar ................ H05K 7/1469 |
| 2008/0255709 | A1 | * | 10/2008 | Balgard ............... H05K 7/1465 700/292 |
| 2010/0061038 | A1 | | 3/2010 | Roth |
| 2015/0187523 | A1 | | 7/2015 | Becker et al. |
| 2017/0005458 | A1 | * | 1/2017 | Burke .................... H02B 1/052 |

FOREIGN PATENT DOCUMENTS

| | | |
|---|---|---|
| DE | 69610741 T2 | 5/2001 |
| DE | 10011385 A1 | 9/2001 |
| DE | 102007027522 B3 | 2/2009 |
| DE | 202010004408 U1 | 4/2011 |
| DE | 202011000835 U1 | 11/2011 |
| DE | 102011101686 A1 | 11/2012 |
| DE | 102012021055 A1 | 4/2014 |
| DE | 102014103575 A1 | 9/2015 |
| EP | 0534538 A1 | 3/1993 |
| FI | 924301 A | 3/1993 |
| FR | 2875373 A1 | 3/2006 |
| JP | 2006185879 A | 7/2006 |
| JP | 2007-014095 A | 1/2007 |
| JP | 2007122928 A | 5/2007 |
| JP | 2010-530117 A | 9/2010 |
| JP | 2013-526758 A | 6/2013 |
| WO | WO2015/103196 A1 | 7/2015 |

OTHER PUBLICATIONS

Translation of International Search Report:PCT/EP2016/061573 dated Oct. 4, 2016.

Translation of Written Opinion:PCT/EP2016/061573 dated Jan. 26, 2017.

* cited by examiner

POWER DISTRIBUTOR

This nonprovisional application is a continuation of International Application No. PCT/EP2016/061573, which was filed on May 23, 2016, and which claims priority to German Patent Application No. 10 2015 213 744.9, which was filed in Germany on Jul. 21, 2015, and which are both herein incorporated by reference.

BACKGROUND OF THE INVENTION

Field of the Invention

The invention relates to a modular power distributor for direct mounting on a mounting rail, comprising a number of power distribution modules, in particular in the form of a rail-mounted device.

Description of the Background Art

In the following, in particular an electrical installation with one or more electrical load circuits, which are supplied with power from a common main power line, is referred to as a power distributor. Within the context of the power distributor, protection mechanisms are provided which individually protect each load circuit against an overload and/or short circuit.

The protection mechanisms are, in particular, mechanical, electronic, or mechatronic protective switches which are connected between a main circuit or a supply and the load circuits. The protective switches are often individually wired to the supply and load by means of flexible lead wires. As a result, the mounting of a power distributor of this kind is particularly labor-intensive. Furthermore, the switching system formed by such a power distributor is relatively intricate due to the individual wiring, which makes repairs and subsequent changes in the mounted state of the power distributor disadvantageously more difficult.

In order to reduce the wiring effort of conventional power distributors, so-called modular power distributors can be used which are composed of a plurality of individual power distribution modules which can be electrically conductively coupled to one another. The power distribution modules are typically mountable side by side as rail-mounted devices directly on a mounting rail (top-hat rail) and, on the one hand, have connections for the supply and the load and, on the other hand, at least one socket-like slot for connecting a protective switch therebetween. The modules, arranged in a row, are typically coupled to one another in an electrically conductive manner and clearly arranged visually by means of a current bar bridging a plurality of modules.

Within the scope of a power distributor of this kind, such power distribution modules fitted with protective switches are provided, in particular, at the branches at which the load circuits branch off from the main power line. In this case, the protective switches are used to disconnect the associated load circuit, when necessary, from the current-carrying main power line.

Typically, when individual power distribution modules are arranged in rows, internal wiring is provided for signaling. For this purpose, the protective switches used have integrated signal contacts (normally closed contacts and normally open contacts), which can be interconnected according to the application in the context of single or group signaling and can be actuated by a switch signal.

Power distributors of this kind are designed according to the current state of the art only for single-pole or single-channel protective switches. To connect a two-core or multicore load circuit, additional external terminals or potential distributors must therefore be connected between two or more single-channel protective switches. This results in an additional interconnection effort and an increased space requirement along the mounting rail or in a switch box.

SUMMARY OF THE INVENTION

It is therefore an object of the invention to provide a power distributor which is suitable and configured for coupling multichannel load circuits to a multichannel protective switch with the least possible connection effort. Furthermore, a protective switch for mounting such a power distributor is to be provided.

The power distributor of the invention can be constructed modularly with a plurality of power distribution modules, arranged in a row, hereinafter also called modules in shortened form. The individual modules and thus the power distributor are suitable and configured for direct mounting on a mounting rail, such as, for example, a top-hat rail or G rail. To this end, the modules can be mounted side by side in a row on the mounting rail in particular in the manner of a rail-mounted device. The module package formed thereby comprises a supply module arranged on one end face and a signal module arranged on the opposite end face of the package, as well as a plurality of connection modules arranged therebetween.

In an exemplary installation situation, the supply module is coupled in an electrically conductive manner via a supply connection to a main power supply or supply. The connection module is used in particular for power distribution or branching to a load circuit, coupled by means of a supply line, and is preferably fitted or can be fitted with an actuatable protective switch. The protective switch automatically interrupts the connected load circuit in case of an overload or a short circuit.

The connection module can have a plurality of load connections for wiring a multichannel load circuit. A switch signal actuating the protective switch can be supplied by means of a first signal connection of the signal module. To this end, the modules are suitably coupled or can be coupled to one another in an electrically conductive manner. A power distributor is provided thereby with which a multichannel load circuit can be connected with a low connection effort. In particular, the multichannel load circuit can be coupled to the main power line only by a single connection module with a fitted and accordingly multichannel protective switch.

The modules comprise a, for example, flat (module) housing made of an electrically insulating material. In an exemplary installation situation, the connection module is coupled to the main power supply or supply for the power distribution or branching by means of the interconnection of the modules to the supply connection of the supply module in an electrically conductive manner.

The connection module can have a socket-like slot for plugging the protective switch on the front housing side, that is, on the (housing) side facing away from the mounting rail. The connected load circuit can be galvanically interrupted or disconnected by the protective switch. The plug connection between the connection module and the protective switch is, for example, designed with multilam, bolt, or, for example, flat plugs.

The modular design of the power distributor enables a high degree of prefabrication and thus comparatively low production and mounting costs. It is possible in particular to adapt a power distributor in a particularly simple manner to a desired number of (multichannel) load circuits, to be connected, by arranging a corresponding number of connection modules in rows. Nevertheless, it is equally conceivable, however, to couple one or more connection modules only to a supply module in the context of a signaling-free wiring. As a result, the power distributor can be used particularly flexibly with regard to an electrical system.

The protective switch can be designed as a mechanical, electronic or mechatronic switch or as a relay, and usually has a supply connection, via which a network-side and therefore current-conducting power line is connected by a first plug-in contact to the connection module, and a load connection, via which the power line outgoing on the load side can be connected to the connection module by a second plug-in contact.

Protective switches can be understood to be, for example, thermal, thermal-magnetic, and electronic device circuit breakers, switch relays, or overcurrent protection devices which have an internal control unit. In particular, the control unit is also set up to actuate a switching element of the protective switch as a function of the switch signal. For this purpose, the protective switch can have two signal contacts (normally closed contacts, normally open contacts), which are connected to the control unit, for the slot of the connection module. The protective switch further comprises at least one communication contact for connection to a communication line, for example, in the context of a bus connection for signal contact functions.

The protective switches can be attached to or placed on the power distributor in the grid pattern predetermined by the connection modules. The connection modules are, in particular, approximately as wide as the protective switches; that is, a connection module is can be used to receive a respective protective switch. In this case, it is preferably possible to operate the fitted protective switches of the power distributor in a series connection and in a parallel connection, optionally additional connections being provided for this purpose on one or more modules.

When designed as a rail-mounted device, the modules, for example, on the housing back have a profiled mounting (clip-on slot)) for attaching the power distributor to the mounting rail. The front side of the housing thus faces a user in the intended installation situation of the modules. The profile direction of the mounting (and of the mounting rail associated therewith) defines a row direction along which a plurality of modules can be arranged next to one another in the manner intended in the mounted state. The housing sides oriented perpendicular to this row direction are hereinafter referred to as (housing) end faces. In accordance with the intended installation position of the modules, the two remaining housing sides are referred to as the (housing) top side or (housing) bottom side.

In an embodiment, at least the supply module and the connection module each have a supply connection for feeding in the supply current with a first coupling contact, a ground connection with a second coupling contact, and a return connection for returning the current in the context of a functional or protective ground with a third coupling contact. The ground connection is used here as a negative connection for protecting a DC voltage network, and as a connection for the neutral conductor in the case of an AC voltage network. The coupling contacts can be arranged in a respectively associated housing slot, which is located on the housing front and passes completely through the respective housing in the row direction. If a plurality of modules are arranged in a row, the respective housing slots align with the associated housing slots of the other modules. This enables the use of current bars which are configured as profile parts and which are pressed into the aligned housing slots and are thus safely shielded by the housings against contact. As a result, the operating potentials are provided for all modules arranged in a row, and the modules are coupled to one another, in particular in parallel, in an electrically conductive manner in the transverse or row direction.

Such current bars are particularly advantageous for reasons of fabrication technology and with regard to high mechanical stability. The aligned arrangement of the coupling contacts also ensures that the coupling contacts of the individual modules can each be bridged by means of a straight current bar, which is particularly advantageous for fabrication reasons and in terms of a circuit structure which is as clear as possible.

The arrangement of the housing slots on the module front sides enables an especially easy mounting of the current bars, which is to be done, in particular, under restricted space conditions, for example, in an electrical cabinet. In addition, the current bars are still visible as a result of the arrangement of the coupling contacts when the modules are installed in an electrical cabinet, which enhances the clarity of an electrical system coupled to the power distributor.

The housing slots can be sized such that they accommodate the respective associated coupling contacts in a finger-safe manner. This makes it possible, in particular, to use a connection module in individual wiring systems without the housing slots having to be covered for safety reasons. The finger-safe (touch-safe) configuration of the housing slots is particularly advantageous, because the housing slots are, for example, arranged on the front side of the housing which is easily accessible in the installation situation.

In an embodiment, a switch signal line, which is formed by the modules and can be integrated, for example, in the modules, is provided for conducting the switch signal. The switch signal line is a substantially internal wiring of the modules for signaling and actuating the mounted protective switches. For this purpose, the switch signal is supplied to a second signal connection of the supply module and is electrically conductively coupled to the signal contacts of the protective switch and thus of the control unit, via the connection module.

The wiring of the switch signal line can be routed through the modules in particular in such a way that the fitted protective switches of the connection modules are connected together in series with respect to their signal connections. The switch signal can be tapped off at the first signal terminal of the signal module for monitoring and evaluation. The transverse wiring of the modules to one another is provided, in particular, by means of first contact elements, wherein the contact elements in the mounted state realize an electrically conductive coupling in the row direction, that is, from housing end face to housing end face between in each case two adjacent modules.

The switch signal line provides an integrated signal line within the modules, arranged in a row, for signaling and actuating the mounted (multichannel) protective switch. The switch signal is supplied, for example, as a signal current from a programmable logic controller (PLC) or a digital input as individual or group signaling, but the use of a signal voltage is also conceivable, however. This eliminates, for example, the need for additional wiring or the use of a backplane bus, which is conducive to a simplified mounting and wiring of the power distributor.

In an embodiment, a communication line for conducting a communication signal is realized in a similar manner by second contact elements. For this purpose, the communication line can extend from a first communication connection of the supply module via the connection modules, where it is coupled by means of the communication contact to the control unit of the fitted protective switch. The communication line continues into the signal module at which the communication signal can be tapped off by means of a second communication connection. By providing the communication line, it is possible to connect bus-capable protective switches as well as internal and external bus systems. As a result, the power distributor is suitable and configured, for example, for an external control unit for the purpose of a superordinate control arrangement, remote-controlled actuation of the protective switches, and/or for the detection of measured values (for example, the switch signal flowing through the protective switches) and for diagnosis in the case of a fault.

In an embodiment, for example, two communication lines can be provided in each case for a communication signal for the power distributor. The first communication line is used, in particular, for conducting a data bus signal and the second communication line for conducting an address bus signal. This makes it possible, for example, to switch in a remote-controlled manner, to reset, monitor, or parameterize the protective switches of different load circuits. Parameterization in this context is to be understood, in particular, to be the setting of, for example, triggering threshold values and control or operating parameters, such as, for example, the nominal current of the particular protective switch. For this purpose, the communication signals are expediently sent to the protective switch control unit, which is suitable and configured for processing and converting such signals.

In an embodiment, the first and second contact elements can be designed with a spring bracket which protrudes laterally from the housing and in the mounted state engages at least partially in an adjacent housing on the end face and couples in an electrically conductive manner with a contacting bracket of the adjacent contact element. For this purpose, the contacting brackets can be placed in an end-face housing receptacle or opening of the respective module. In the mounted state, therefore, an electrically conductive coupling is provided in the row direction, that is, from housing end face to housing end face between adjacent modules. In this way, on the one hand, an easily detachable plug-in or terminal contact is provided along the row direction, which is beneficial for the flexibility and modular design of the power distribution system. On the other hand, the contact points of the contact elements are arranged in a touch-safe manner within the housings and are essentially completely covered by the end-face housing walls of the modules arranged in a row. Alternatively, however, it is also conceivable to make the contact elements as a plug/socket connection, for example, with flat plugs.

The switch signal and communication signals are typically low-current/low-voltage signals, so that the contact elements are constructed, in particular, as low-current contacts. In order to obtain a lowest possible transition resistance, the contact elements can be surface-finished, for example, gold-plated or silver-plated. However, an embodiment with contact elements made of a nonferrous metal, which can be tin-plated for the purpose of an improved contact force, is also conceivable.

In an embodiment, the connection module is suitable and configured for accommodating and contacting both single-channel and multichannel protective switches. For this purpose, the connection module has a contact opening on the load output side for a plug-in contact of the protective switch. The contact opening is configured, in particular, as a divided plug base contact; the plug base partial contacts formed thereby are, on the one hand, galvanically separated from one another and, on the other, coupled in an electrically conductive manner in each case to a separate load connection. The plug-in contact, which can be made as a flat plug, hereby expediently has a number of flat pins which correspond to the number of switch channels and can be connected to a corresponding number of plug base partial contacts. Due to the division of the plug base contact, the connection module is suitable and configured in a structurally simple and thus cost-effective manner for using a multichannel protective switch to connect a multichannel load circuit.

In this case, the number of divisions expediently corresponds to at least the number of current channels or cores of the load circuit. In particular, furthermore, the use of a single-pole protective switch for connecting a single-core load circuit with one of the multiple load connections is made possible. Furthermore, additional external terminals or potential distributors are not required in the connection of multi-core load circuits, as a result of which, on the one hand, the interconnection effort is advantageously reduced. On the other hand, the power distributor is thereby particularly space-saving, wherein the preferably flat modules and the configuration as rail-mounted devices with a particularly compact power distributor design are additionally advantageous.

In a suitable design, a display module for visually monitoring the switch signal line can be connected to the signal module. In particular, the display module has a display LED as an optical display element as well as an additional circuit that amplifies the switch signal. This enables a user to check the operating state of the switch signal circuit by simple visual inspection of the display LED. Alternatively, it is likewise conceivable that the display module or the display LED and the additional circuit are already integrated in the signal module.

The display LED, for example, lights up during operation when a current flows through the switch signal line. If the display LED goes out, the user is informed in a simple manner that there is an interruption of the switch signal line. The amplifying additional circuit is constructed in a particularly simple embodiment, for example, by a series connection of a resistor, display LED, a protection diode, and, if applicable, an overvoltage protection.

In an embodiment, the additional circuit has an internal power supply unit as a voltage supply and an electronic evaluation unit, the display LED can be made multicolored, in particular as a double LED. Due to the multicolored LED, clear signaling of the switch signal circuit state is provided to the user by appropriate control of the evaluation unit. The integrated power supply unit hereby provides a short-circuit-proof, separate supply for the LED, so that even in the event of a short circuit of the switch signal line, a visual signal is sent to the user and a failure or short circuit can be noticed quickly and reliably.

The evaluation unit and LED are, in particular, coupled to a signal light display, wherein the evaluation unit is suitable and configured for detecting the switch signal, for example, by measuring current or voltage, and for changing the illuminated color of the LED as a function of the detected measured value. The double LED can be connected as a signal light display, which can visually display the states OFF, green, yellow, and red, if applicable also flashing.

The advantages achieved with the modular power distributor of the invention include, for example, in the modular design and in the possibility of connecting both single-channel and multichannel load circuits to corresponding protective switches. In particular, only one connection module for the respective load circuit is required per protective switch, so that the power distributor is designed to be particularly space-saving. Further, single-channel and multichannel load circuits can be connected simultaneously and with only one power distributor. Further, a coupled signal operation is also realized by the switch signal line for the simultaneous use of single-channel and multichannel protective switches.

The connection possibilities of the connection modules enable the modular and particularly flexible structure of a power distribution system with thermal, thermal-magnetic, and electronic device protective switches, switching relays, or electronic automatic circuit breakers with signal contacts. These can be operated both in a classic circuit of normally open contacts (series connection) and in a circuit of normally closed contacts (parallel connection). In addition, the power distributor is provided with at least one communication interface (data bus and address bus), so that the connection of novel, bus-capable protective switches and devices to internal and external bus systems is made possible without any problems. A device bus system for remote-controlled switching, resetting, monitoring, parameterization, etc., can be connected during operation of the power distributor. Furthermore, a visual inspection of the protective switch signaling is provided in a structurally simple manner by the display module which can be connected to the signal module as necessary.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
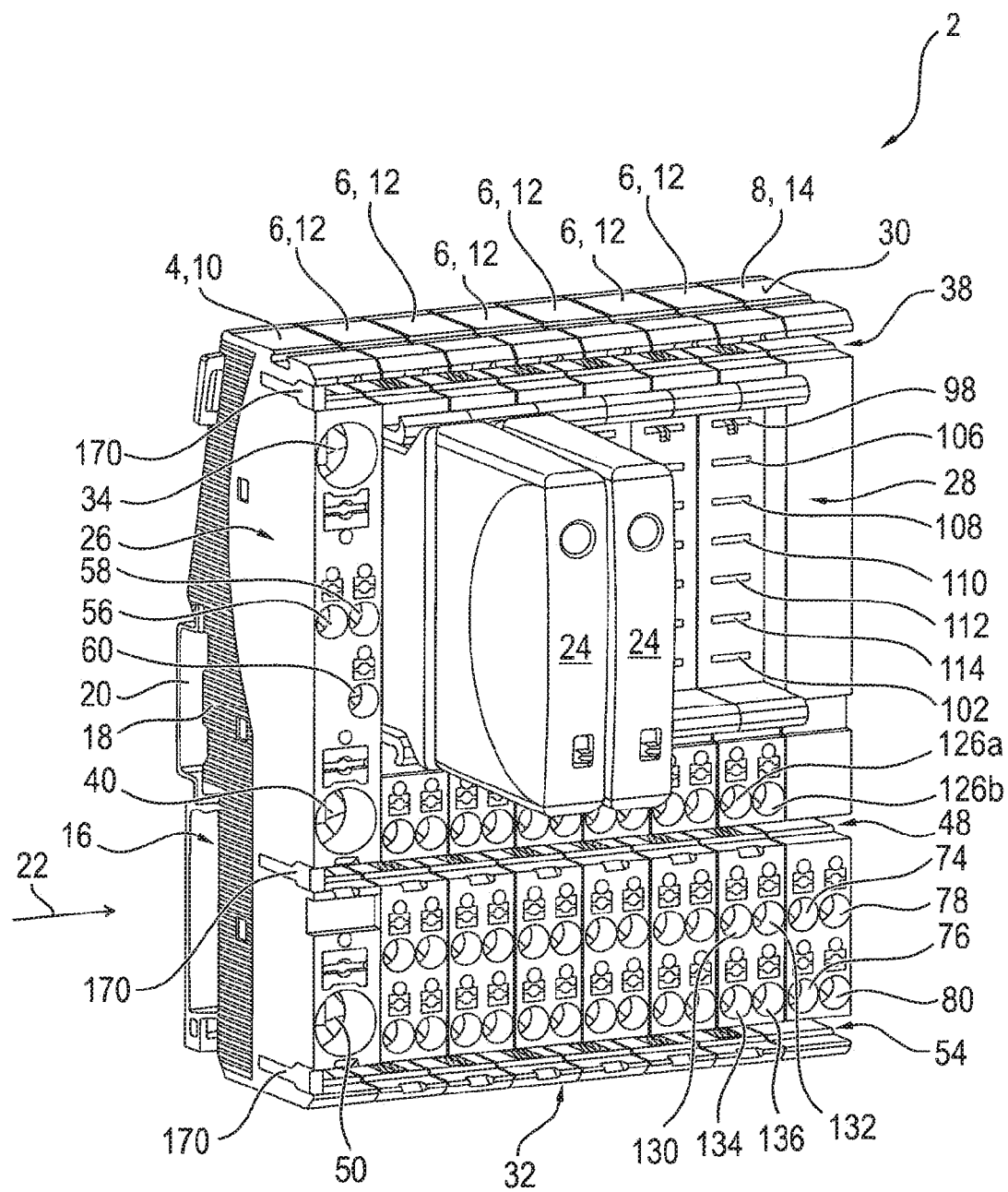
FIG. 1 shows a perspective view of a power distributor with a supply module, a signal module, six connection modules arranged therebetween, and two fitted protective switches.
Figure 2:
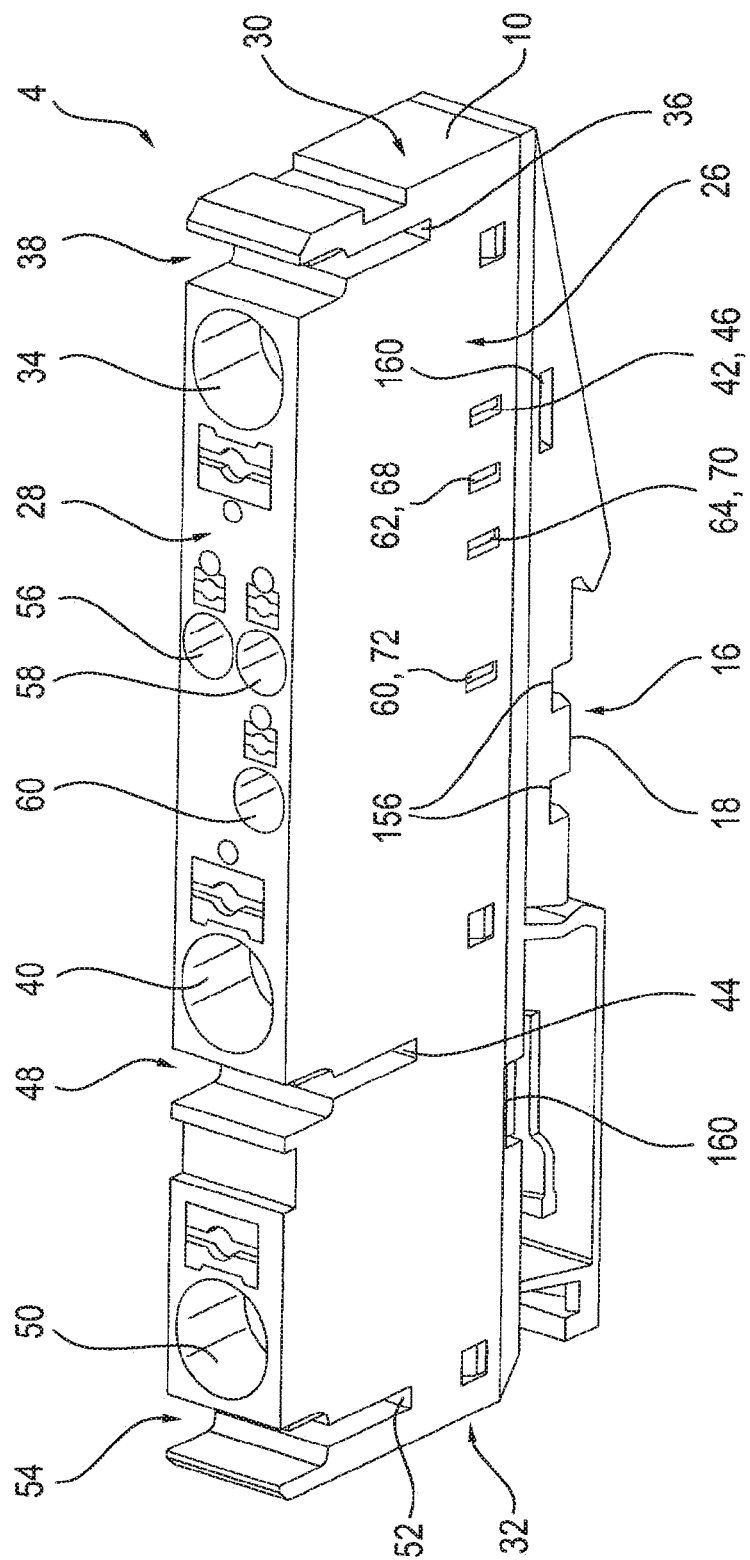
FIG. 2 shows the supply module in a perspective view.
Figure 3:
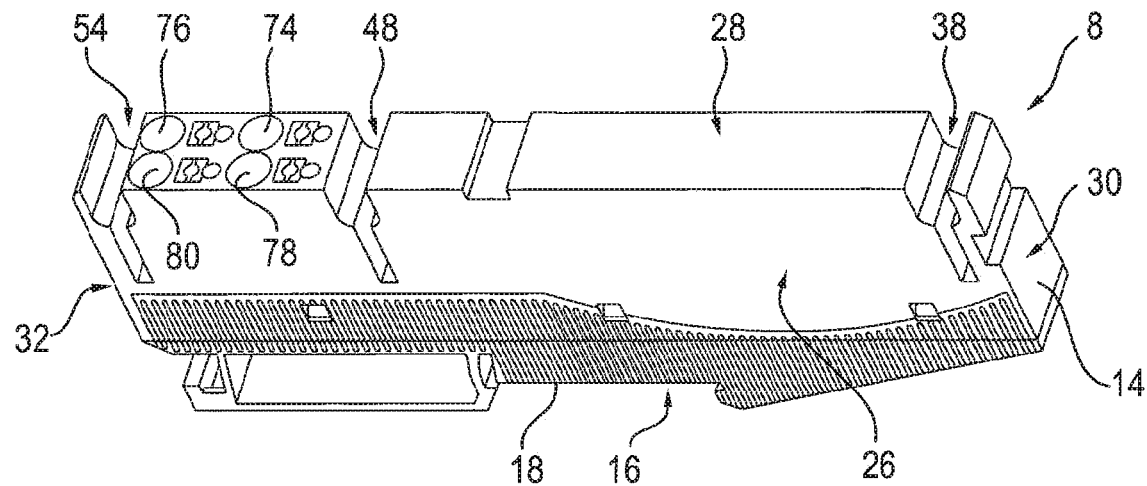
FIG. 3 shows the signal module in a perspective view.
Figure 4:
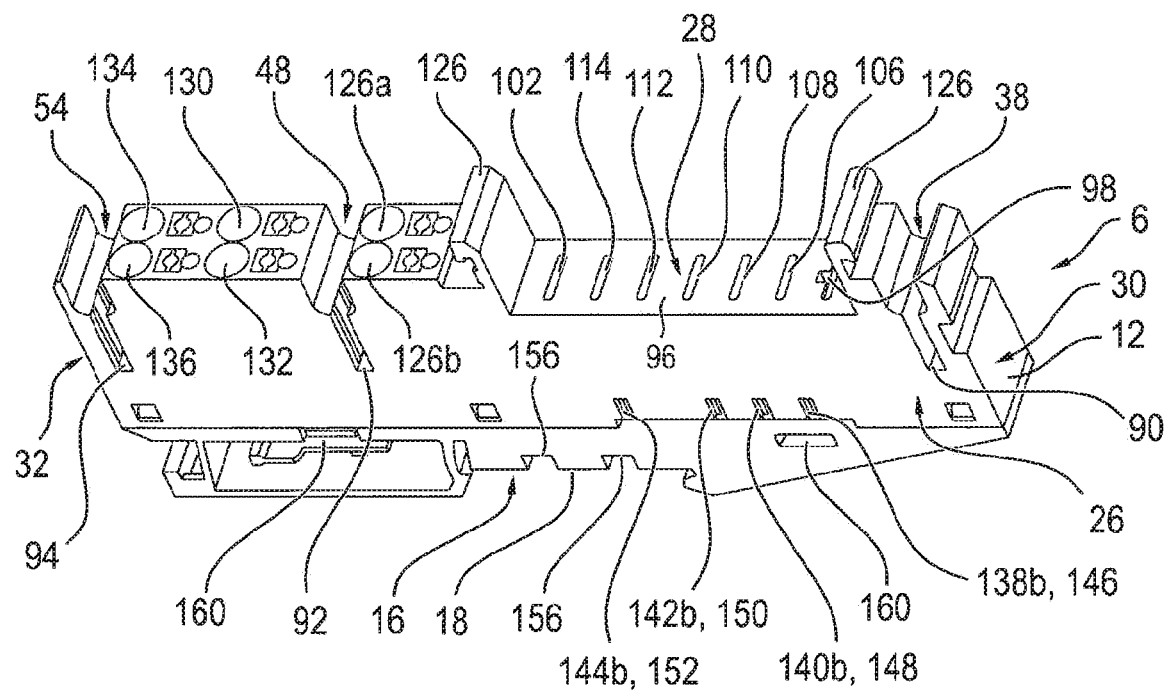
FIG. 4 shows a connection module in a perspective view.

Power distributor 2, shown in FIG. 1, comprises a supply module 4, six connection modules 6, and a signal module 8 as (power distribution) modules, which are shown individually in FIGS. 2 to 4. Each of modules 4, 6, 8 comprises a separate housing 10, 12, or 14, respectively, that is, separate from the other modules 4, 6, 8. Each module 4, 6, 8 is formed as a rail-mounted device and accordingly has on a housing back 16 a groove-like receptacle 18 with which the respective module 4, 6, 8 can be snapped onto a mounting rail 20 for mounting purposes.

The profile direction of this receptacle 18, and correspondingly in the mounted state also the profile direction of mounting rail 20 corresponding to this receptacle 18, define a row direction 22 along which modules 4, 6, 8 are lined up in a row. In the exemplary embodiment shown in FIG. 1, two protective switches 24 are arranged on a respective connection module 6 inside the package formed by modules 4, 6, 8, wherein supply module 4, on the one hand, and signal module 8, on the other, flank connecting modules 6 in row direction 22 as side parts on the outside.

The housing surfaces of each module 4, 6, 8, said surfaces being opposite to one another in row direction 22, are hereinafter referred to as end faces 26 of the respective module 4, 6, 8. The housing side of each module 4, 6, 8, said side being opposite to housing back 16, is designated as front side 28 of module 4, 6, 8. This front side 28 faces a user, when power distributor 2 is mounted in an electrical cabinet. The two other housing sides of each module 4, 6, 8 are designated as top side 30 or bottom side 32, independently of the actual position in the surrounding space, according to the conventional installation position of module 4, 6, 8.

Supply module 4, shown again separately in FIG. 2, comprises a supply connection 34 for the electrical contacting to a main power circuit and thus for supplying an electric current to power distributor 2. Supply connection 34 is arranged on front side 28 of housing 10 near top side 30 and is formed as a connecting terminal for a wire or stranded conductor of the main power circuit. Supply connection 34 is electrically conductively coupled within housing 10 to a coupling contact 36, which is arranged within a groove-like housing slot 38.

Supply module 4 has a ground connection 40 at approximately half the height of housing 10 for connecting to a negative pole or a neutral conductor. Ground connection 40 is arranged on front side 28 of housing 10 and is configured as a connecting terminal for a wire or stranded conductor. Ground terminal 40 is electrically conductively coupled within housing 10 to a plug socket as a contact element 42, as well as to a second coupling contact 44. Contact element 42, subsequently referred to as a plug socket, is arranged near top side 30 within a housing opening 46 on end face 26, which in the mounted state faces a connection module 6.

Coupling contact 44 is positioned in a housing slot 48 of housing front side 28, which slot is placed centrally on housing 10.

Supply module 4 further comprises a return connection 50 for electrical contacting to a current return in the context of a protective or functional ground. Return connection 50 is arranged near bottom side 32 on front side 28 of housing 10 and, like supply connection 34 and ground connection 40, is formed as a connecting terminal. Return connection 50 is in turn electrically conductively coupled to a coupling contact 52 within a housing slot 54 arranged in the region of bottom side 32.

Groove-like housing slots 38, 48, 54 are introduced in housing 10 of supply module 4 in particular in such a way that they are open towards housing front side 28. Housing slots 38, 48, 54 extend in row direction 22 substantially over the entire housing width and are thus open towards the two opposing end faces 26 of housing 10.

Three further connecting terminals for a signal connection 56 as well as two communication connections 58 and 60 are provided between supply connection 34 and ground connection 40 on the housing front side. Connections 56, 58, 60 are made smaller in comparison with connections 34, 40, 50, and can be designed as switching signals or communication signals for supplying low currents. Connections 56, 58, 60 are coupled to ground connection 40 within housing 10 with contact elements 62, 64, 66 designed as plug sockets. The contact elements or plug sockets 62, 64, 66 are accessible from end face 26 by means of approximately rectangular housing openings 68, 70, 72.

Signal module 8 is explained in greater detail below with reference to FIG. 3. Housing 14 of signal module 8 has three housing slots 38, 48, and 54, which are essentially identical to those of supply module 4, but do not have any coupling contact with the housing interior. Between the lower housing slots 48 and 54, four connecting terminals 74, 76, 78, and 80 are disposed as a ground connection 74, a signal connection 76, and two communication connections 78 and 80.

Connections 74, 76, 78, 80 are electrically conductively coupled to contact elements 82, 84, 86, 88 within housing 14. Contact elements 82, 84, 86, 88, which are referred to as plugs below, are in particular made as flat plugs and protrude at least partially from housing 14 from end face 26 facing a connection module 6 in the mounted state. To this end, plugs 82, 84, 86, 88 are arranged in particular in such a way that in the mounted state they are positioned substantially at a height with plug sockets 42, 62, 64, 66.

The construction of a connection module 6 is explained in greater detail below with the aid of FIGS. 4 and 5, only one connection module 6 being provided with reference characters by way of example in FIG. 1. Housing 12 of connection module 6 has three housing slots 38, 48, and 54, which are substantially identical to those of supply module 4, each with a coupling contact 90, 92, 94 in the housing interior. A slot 96 on the housing front side for protective switch 24 is mounted between housing slots 38 and 48. Slot 96 has a first contact opening 98 for a first plug-in contact 100 (preferably made as a flat plug) of protective switch 24, as well as a second contact opening 102 for a second plug-in contact 104 (preferably likewise made as a flat plug) of protective switch 24.

Slot 96 is also provided with five further contact openings 106, 108, 110, 112, and 114 for corresponding signal or communication contacts 116, 118, 120, 122, and 124 of protective switch 24 (the contacts preferably being made as flat contacts). As can be seen in particular in FIG. 5, contact openings 98, 102, 106, 108, 110, 112, and 114 of slot 96 are made in particular as plug base contacts. Contact openings 98, 102, 106, 108, 110, 112, 114 and plug or signal contacts 100, 104, 116, 118, 120, 122, 124 are made complementary to one another in the sense of plug/socket pairs.

Slot 96 furthermore has in the top and bottom region in each case a hook-like latching element 126 for the nondestructive clamp fastening of protective switch 24. For this purpose, the housing of protective switch 24 has, in a manner not described in greater detail, a corresponding molded-on abutment or rear-engaging element for the purpose of simple, vibration-free, and operationally secure latching or clipping.

Two connecting terminals are disposed below slot 96 as load connections 126*a* and 126*b* for connecting a consumer circuit or load circuit. Connecting terminals 126*a*, 126*b* are electrically conductively coupled to contact opening 102 in the housing interior. Furthermore, contact opening 98 in the interior of housing 12 is coupled to coupling contact 90 of housing slot 38 substantially integrally by means of an electrically conductive conductor rail 128. Thus, in the mounted state, protective switch 24 is connected between coupling contact 90 and load connections 126*a*, 126*b* for interrupting the load circuit.

Connection module 6 includes further four connecting terminals 130, 132, 134, and 136 disposed between bottom housing slots 48 and 54 as two ground connections 130, 132 and two return connections 134, 136. In the interior of housing 12, ground connections 130 and 132 are electrically conductively connected each to a coupling contact 94 of housing slot 54 and return connections 134 and 136 to a respective coupling contact 92 of housing slot 48.

Contact openings 106, 108, 110, 112, and 114 are electrically conductively coupled to four contact elements 138, 140, 142, and 144. Contact elements 138, 140, 142, and 144 are, in particular, made as plug/socket pairs, the plugs in the following text having the additional reference character "a" and the sockets the additional reference character "b." Plug sockets 138*b*, 140*b*, 142*b*, and 144*b* are arranged in end-face housing openings 146, 148, 150, and 152, and plugs 138*a*, 140*a*, 142*a*, and 144*a* project at least partially from the opposing end face 26 of housing 12, as can be seen in particular in FIG. 5.

Figure 5:
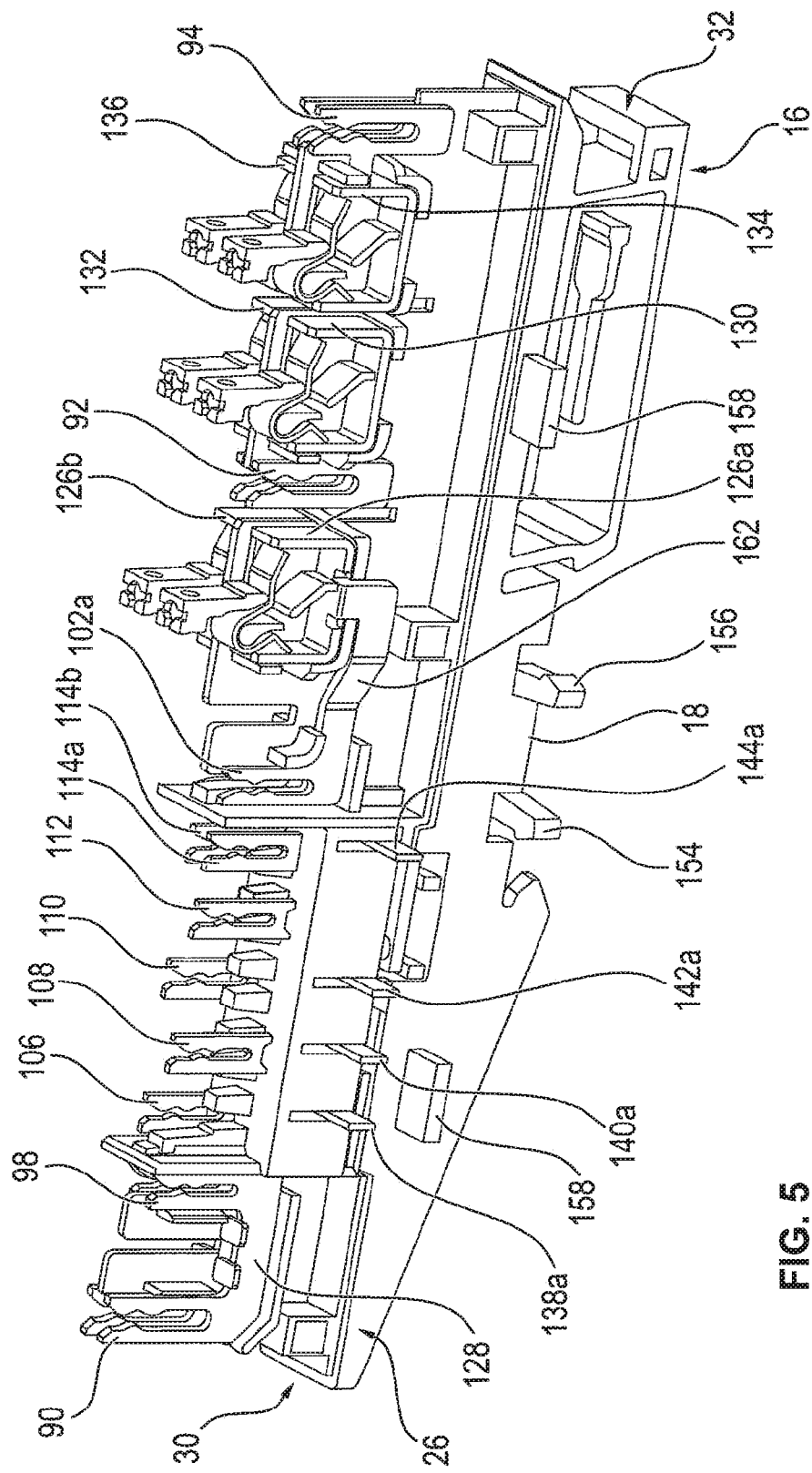
FIG. 5 shows a connection module without a housing in a perspective view.

As is clearly shown in FIG. 5, housings 12 and 14 of connection modules 6 and of signal module 8 have two latch tabs 154, which protrude over the particular end face 26, on housing back 16 in the region of receptacle 18. For the purpose of easier mounting of modules 4, 6, 8, latch tabs 154 can be latched or clipped with corresponding latch receptacles 156 of connection modules 6 and supply module 4, latch receptacles 156 being arranged on end face 26 opposite the latch tabs 154. Housings 12, 14 further also have two joining extensions 158, which are molded on and extend beyond end face 26, on latch tab-side end face 26, for facilitating the stringing or plugging together of modules 4, 6, 8. In the mounted state, joining extensions 158 at least partially engage in corresponding joining receptacles 160 of adjacent modules 4, 6 for the purpose of vibration-free and operationally secure attachment.

Figure 6B:
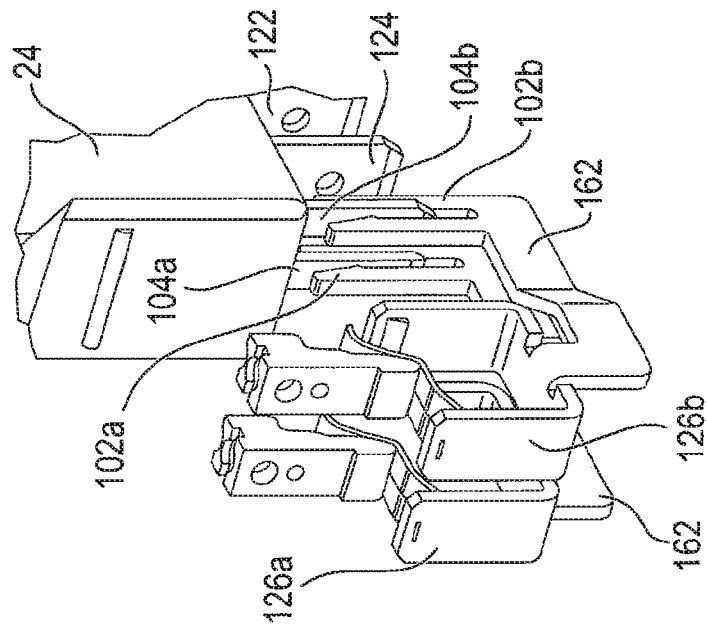
FIGS. 6a and 6b show in a perspective view a split plug base contact of the connection module with a coupled flat plug of a protective switch, for different versions of the flat plug.
Figure 6A:
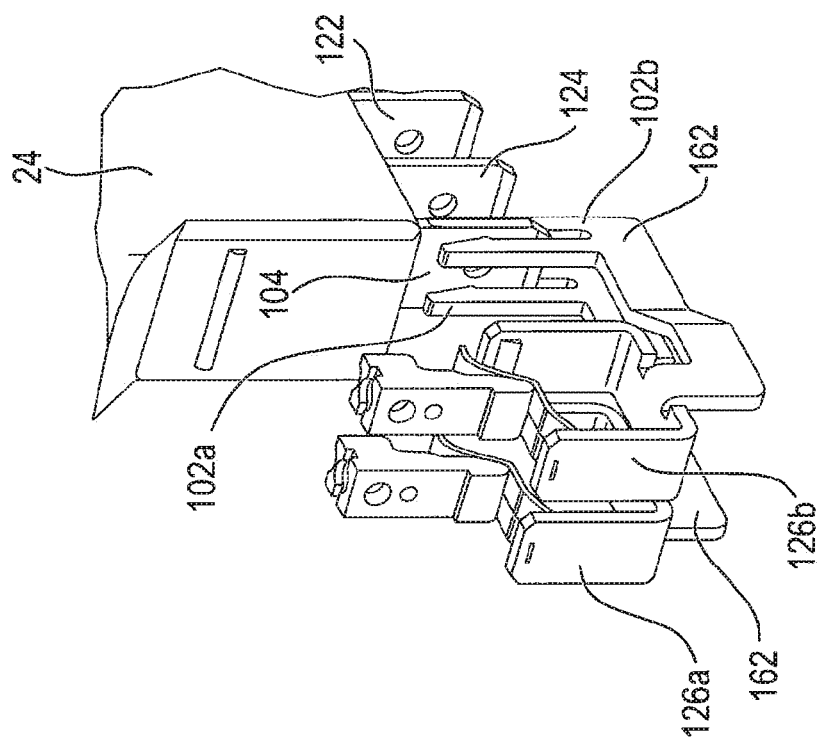

As is particularly apparent in FIGS. 6*a* and 6*b*, the plug-base-like contact opening 102 is designed, in particular, as a plug base contact that has been divided in two. The plug base partial contacts 102*a* and 102*b* thus formed are electrically conductively coupled to load connections 126*a* or 126*b*, respectively, substantially by means of a respective conductor rail 162. As a result, contact opening 102 is suitable and configured to receive both single-channel and two-channel protective switches and to connect them separately to a respective load circuit.

In FIG. 6*a*, a single-channel protective switch 24, which is in contact with contact opening 102, is shown in part with plug-in contact 104, formed as a single-tab flat plug. In this exemplary embodiment, both plug base partial contacts 102a and 102b contact the same plug-in contact so that the same output current is provided at load outputs 126a and 126b.

The contact with a two-channel protective switch 24 for connection to a two-channel load circuit is shown in FIG. 6b. In this exemplary embodiment, plug-in contact 104 is made as a flat plug with a plug tab divided in two. In this case, plug-in contacts 104a and 104b thus formed, galvanically separated from one another, contact the plug base partial contacts 102a or 102b, respectively. As a result, it is possible to connect both single-channel and two-channel protective switches 24 and load circuits to a connection module. In particular, it is thereby possible to operate single-channel and two-channel protective switches 24 simultaneously in two connection modules 6 of the same power distributor 2.

In order to mount power distributor 2, a signal module 4 with a number of connection modules 6, corresponding to a number of load circuits to be connected, and a signal module 8 according to FIG. 1 are arranged in a row on the end face. In this case, modules 6, 8 are (plug) connected aligned and in a disconnectable manner to the corresponding latch receptacles 156 of modules 4, 6 on end face 26 of the respectively adjacent module 4, 6, 8 by means of latch tabs 154 on end faces 26 of each housing 12, 14. End faces 26 of connection modules 6 are thus substantially completely covered by supply module 4, adjacent connection modules 6, and signal module 8. As becomes clear particularly in FIG. 1, housing slots 38, 48, and 54 of adjacent modules 4, 6, 8 are aligned with one another, so that in each case a substantially continuous and straight-line groove-like extension through modules 4, 6, 8 is realized.

Figure 7:
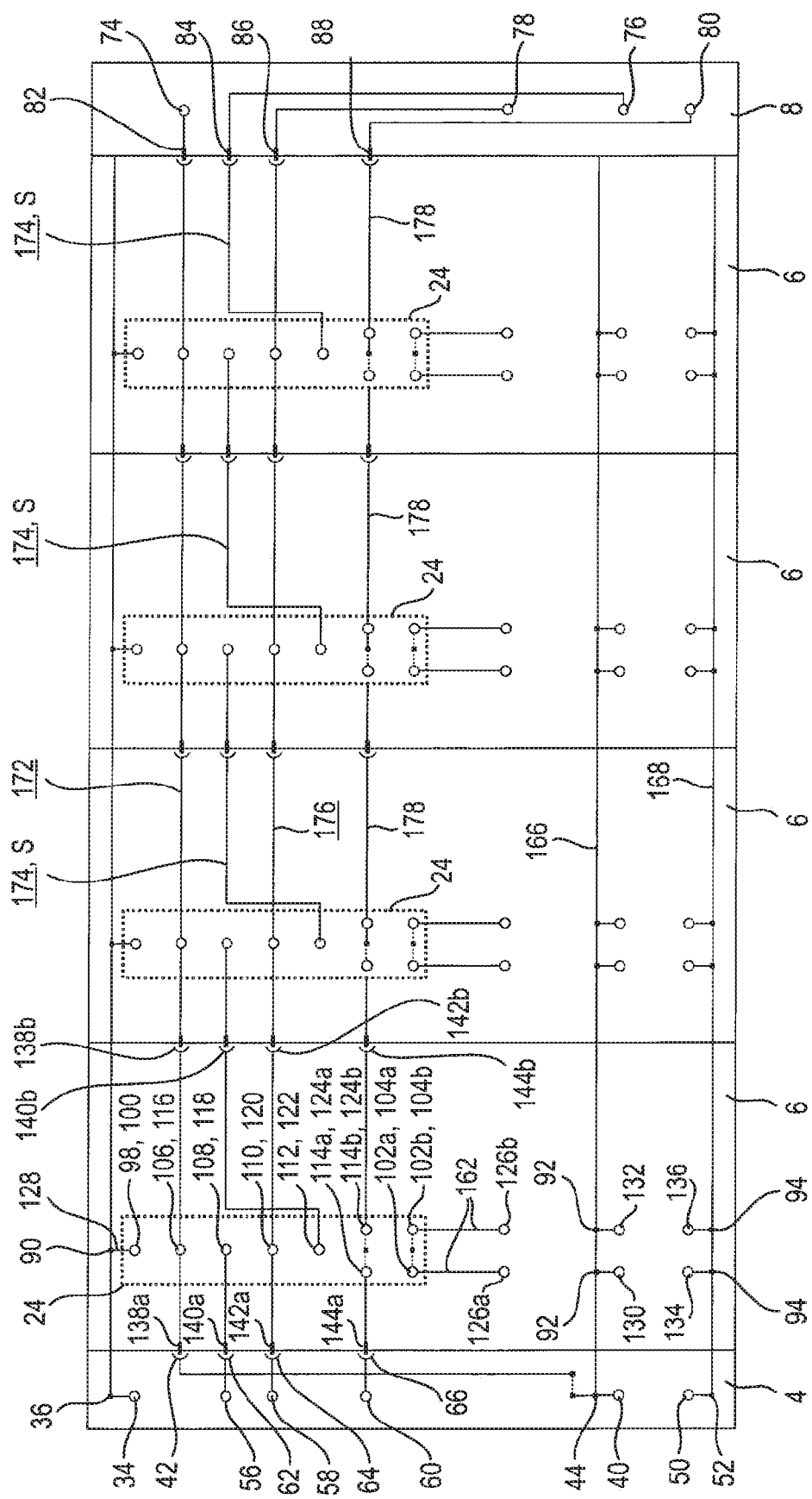
FIG. 7 shows a circuit diagram for a power distributor with a supply module, four connection modules fitted with protective switches, and a signal module.

In the context of a power distributor 2 of this kind, supply connection 34 of supply module 4 is connected in parallel with modules 4, 6, arranged in a row, in that a current bar 164 is pressed into aligned housing slots 38 of modules 4, 6, 8, as indicated in FIG. 7, and is thus contacted with coupling contacts 36, 90. Current busbar 164 is hereby dimensioned in terms of its length such that it extends over the entire width of all modules 4, 6, 8 to be integrated into power distributor 2. Modules 4, 6, which are thus connected in parallel, are connected hereby to an external voltage source by conventional wiring of the main power circuit with the connecting terminal of supply connection 34.

Ground connections 40, 130, 132 and return connections 50, 134, 136 of modules 4, 6, arranged in a row, are likewise connected in parallel by pressing in each case a current bar 166 and 168 into housing slots 48 and 54, wherein ground connection 40 is connected in particular to a ground, and return connection 50 in particular to a protective or functional ground, as a return potential. The individual load circuits of power distributor 2 are then connected to an associated connection module 6 in an electrically conductive manner by connecting the particular supply lines of the load circuit to load connections 126a and/or 126b of connection modules 6, and the return line of the load circuit to the connecting terminals of return connections 134 and/or 136 of connection modules 6.

In order to close in a touch-safe manner housing slots 38, 48, 54 of modules 4, 8 in regard to end faces 26, which in each case are situated outwardly in row direction 22, each housing slot 38, 38, 54 is provided with an insulating cover element 170, as shown in FIG. 1 for supply module 4.

The resulting connection of modules 4, 6, 8 in the mounted state is shown in FIG. 7 by way of example for a power distributor 2 with four connection modules 6, each fitted with a protective switch 24. The connections of connection module 6 and of protective switch 24 are shown in FIG. 7 by way of example only for a connection module 6 and a protective switch 24.

Power distributor 2 is connected to a main power line via supply connection 34 of supply module 4. A load circuit is branched off by coupling contact 36 by means of current bar 164 from each connection module 6 by means of coupling contacts 90. Via current bar 128, the branched load current flows via contact opening 98 and plug-in contact 100 into a protective circuit of protective switch 24. The protective circuit preferably has an electronic switching element for interrupting the connected load circuit in the event of an overload. The protective switch with load connections 126a and 126b is connected to the supply line(s) of the load circuit via the optionally two-tab plug-in contact 104, optionally provided as a two-way connection, and contact opening 102 or plug base partial contacts 102a and 102b. The load circuit is returned by means of the connection to return connections 134 and/or 136.

Finally, the connection modules are fitted with protective switches 24. Protective switches 24 can be plugged in at slots 96 in a simple, time-saving, and easy manner. Protective switches 24 can be exchanged furthermore particularly easily when necessary by means of the latching or clipping.

As becomes clear in particular in FIG. 7, the package formed by modules 4, 6, 8 is achieved in an electrically conductive manner by contact elements 42, 62, 64, 66, 82, 84, 86, 88, 138, 140, 142, 144, which are coupled in the manner of a plug/socket connection, in the row direction from housing end face 26 to housing end face 26 by a ground line 172, a switch signal line 174, a first communication line 176, and a second communication line 178 from supply module 4 to signal module 8. Ground line 172, switch signal line 174, and communication lines 176 and 178 are arranged running substantially parallel within housings 10, 12, 14 to one another and with respect to current bars 164, 166, and 168.

Ground line 172 is connected to coupling contact 44 and is coupled to plug 138a of adjacent connection module 6 by means of the plug socket 42 of supply module 4. Ground line 172 continues via contact opening 106, at which it is coupled by means of signal contact 116 from protective switch 24 as a zero voltage reference potential. By means of plug socket 138b, ground line 172 extends in an identical manner further through adjacent connection modules 6 until plug socket 138b of the outermost connection module 6 opens into plug 82 of signal module 8. The negative pole or neutral conductor connected to ground connection 40 of supply module 4 can thus also be tapped off at ground terminal 74 of signal module 8. Ground line 172 formed by contact elements 42, 138, and 82 is thus at the same electrical potential as the substantially parallel current bar 168.

Switch signal line 174 serves to conduct a switch signal S which can be actuated by protective switches 24 and is supplied by means of signal connection 56 of supply module 4. Switch signal S is, for example, a current or voltage signal of a programmable logic control (PLC) of an external control unit of power distributor 2. Signal line 174 continues via plug socket 62 and plug 140a into connection module 6 arranged in series. In connection module 6, switch signal S is conducted to protective switch 24 via contact opening 108 and signal connection 118. In protective switch 24, switch signal line 174 is continued and is coupled to the electronic switching element of protective switch 24 such that the switching element can be actuated by the switch signal. Switch signal line 174 is connected to plug socket 140b via signal connection 122 and contact opening 112. By means of plug socket 140*b*, switch signal line 174 continues to run identically through connection modules 6, arranged in series, and ends with plug 84 in signal connection 76 of signal module 8.

Communication line 176 is used to conduct a communication signal D. Communication signal D is preferably a data bus signal from the external control unit for power distributor 2, so that communication signal D is subsequently also referred to as a data bus signal and communication line 176 as a data bus line. Data bus signal D is supplied by means of the communication or data bus connection 58 through supply module 4. Plug 142*a* of adjacent connection module 6 is contacted via plug socket 64; contact opening 110 is connected to the module in an electrically conductive manner with signal or communication contact 120 of protective switch 24. By means of plug socket 140*b*, adjacent connecting modules 6, and with them protective switches 24, are connected in series. Data bus line 176 ends with plug 86 of signal module 8 in communication or data bus connection 78 by means of the plug connection of plug socket 140*b*.

Communication line 178 is used to conduct a communication signal A. Communication signal A is preferably an address bus signal of the external control unit for power distributor 2, so that communication signal A is subsequently also referred to as an address bus signal and communication line 178 as an address bus line. Address bus signal A is supplied to supply module 4 by means of communication or address bus connection 60. Plug 144*a* is contacted via plug socket 66 of adjacent connection module 6, to which contact opening 114 is connected in an electrically conductive manner. Contact opening 114 is connected to signal or communication contact 124 of protective switch 24. Protective switch 24, which is a two-channel switch in this exemplary embodiment, is preferably coupled to address bus line 178 with a split communication contact with partial contacts 124*a* and 124*b*.

In the exemplary embodiment shown in FIG. 7, protective switch 24 is made, in particular, as a two-channel switch, wherein contact opening 114 is contacted in a similar manner to contact opening 102 by two partial connections 114*a* and 114*b* with the two-tab flat plug of signal contact 124*a*, 124*b*. Between signal contacts 124*a* and 124*b*, address bus signal A within protective switch 24 is preferably coupled to a protective switch control unit by means of signals. Contact opening 114*b* is coupled to plug 144*b*, so that address bus line 178 passes from adjacent connection modules 6 to plug 88 of signal module 8. Address bus signal A can thus be tapped off at signal module 8, therefore, at communication or address bus connection 80.

Figure 8:
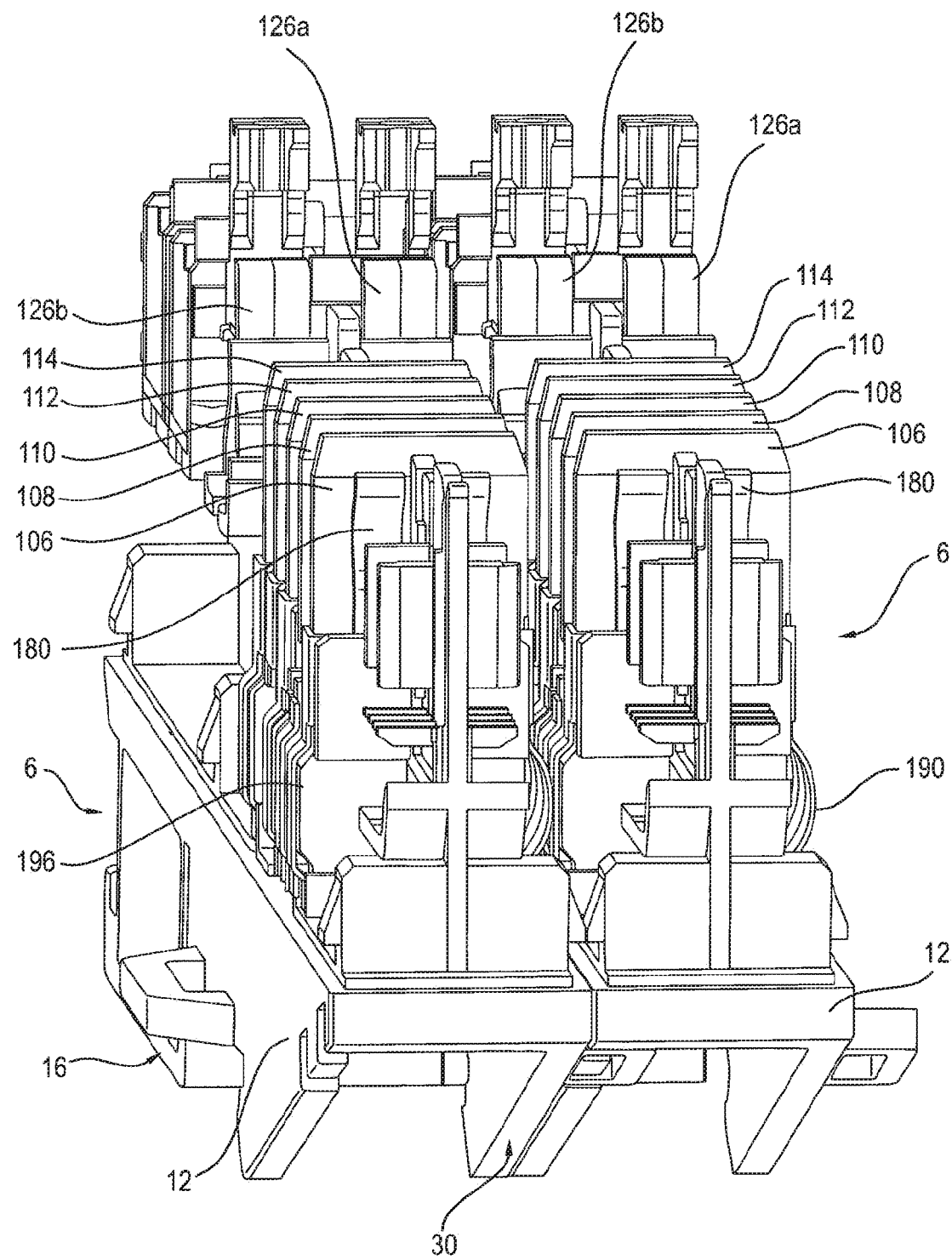
FIG. 8 shows in a perspective view, looking at the top side, two coupled connection modules without a housing, each having three contact elements.
Figure 9:
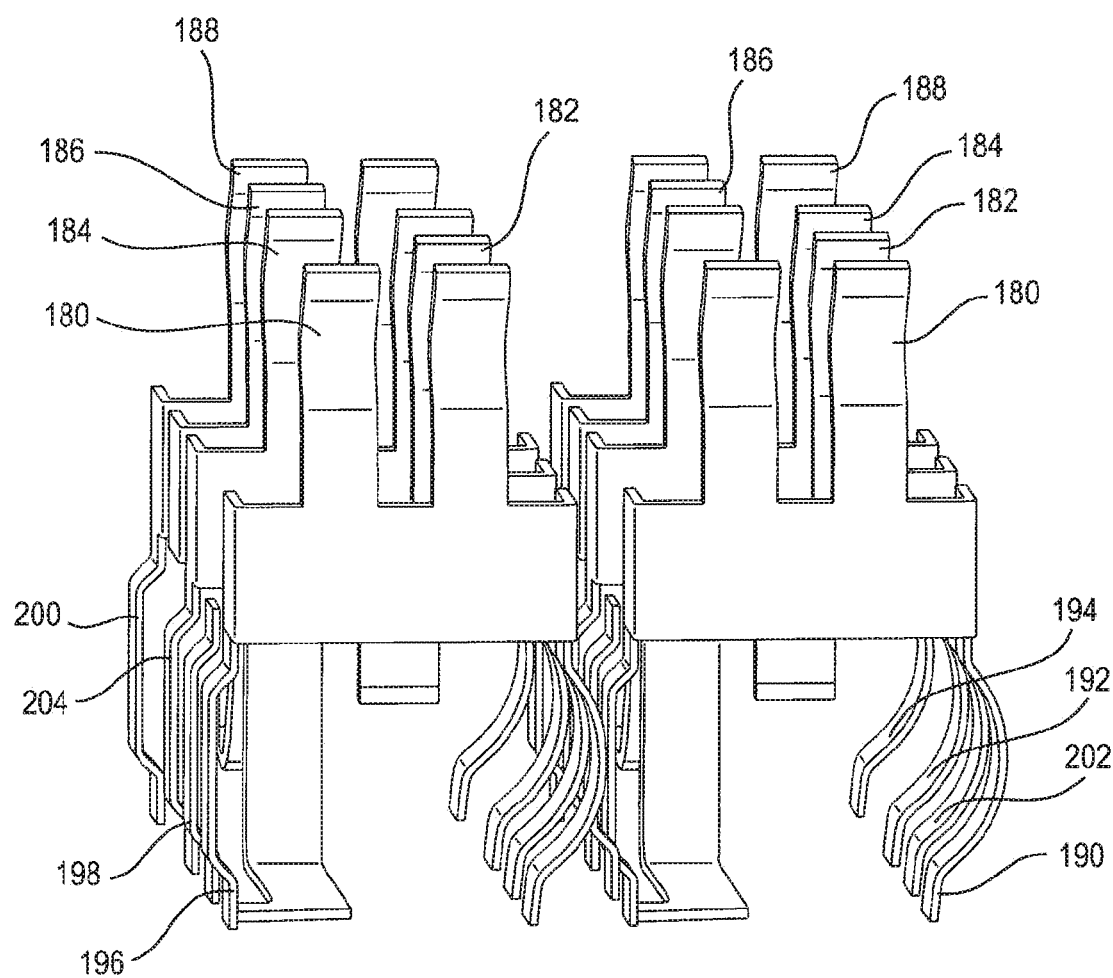
FIG. 9 shows the contact elements in a perspective view.

An alternative embodiment of contact elements 42, 62, 64, 66, 82, 84, 86, 88, 138, 140, 142, 144 for electrically conductive contacting between modules 4, 6, 8 is described in greater detail with use of FIGS. 8 and 9, for example, by means of an alternative variant of contact elements 138, 140, 142, and 144.

Alternative contact elements 180, 182, 184, 186, and 188 are made as one-piece stamped bent parts, in particular as a plug base half of contact openings 106, 108, 110, 112, and 114, respectively. Contact elements 180, 184, and 188 are each made with two coupled plug base tabs, which each have a spring bracket 190, 192, 194 and a connecting bracket 196, 198, 200 towards housing back 16. Contact element 182 has a spring-bow-side plug base tab, which is coupled to a spring bracket 202. Contact element 186 has a complementary contact-bracket-side plug base tab, which is coupled to a contact bracket 204.

Spring brackets 190, 192, 194, and 202 correspond, in their contacting function, in the mounted state to connectors 138*a*, 140*a*, 142*a*, and 144*a* of the preceding exemplary embodiments. Correspondingly, in this exemplary embodiment, contacting brackets 196, 198, 204, 200 are the electrically conductive coupling equivalent to plug sockets 138*b*, 140*b*, 142*b*, and 144*b*.

Spring brackets 190, 192, 194, 202 are bent, flexurally elastic elements which protrude at least partially from end face 26 of housings 12 and, in the mounted state, engage housing openings 146, 148, 150, 152 of end face 26 of adjacent housing 12, and there, as shown in FIG. 9, adjoin in a contacting manner contacting brackets 196, 198, 200, 204 at least in the region of their arc apex.

Figure 10:
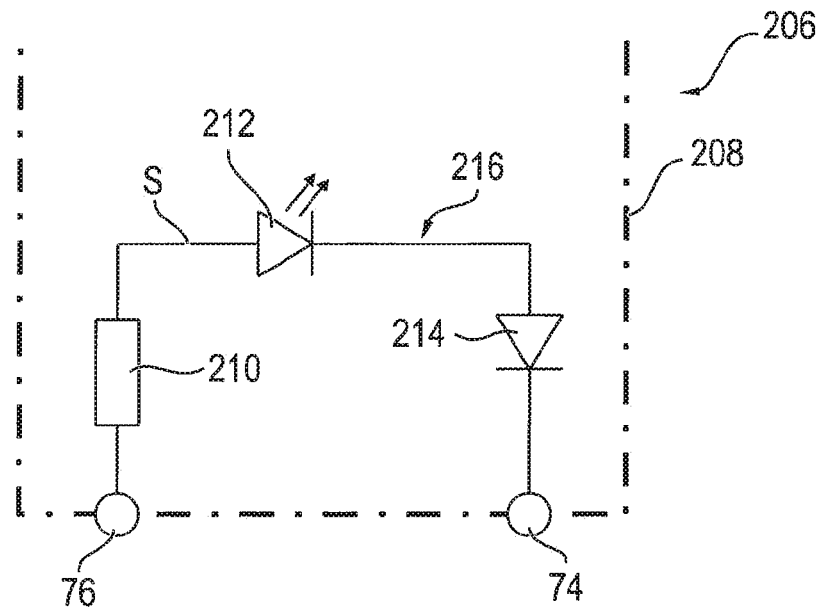
FIG. 10 shows a circuit diagram for a display module, which can be coupled to the signal module, in a first embodiment.

A display module 206 for signal module 8 is shown schematically in FIG. 10. Display module 206 includes a housing 208, a series resistor 210, a green display LED 212, and a reverse polarity protection diode 214. Series resistor 210, display LED 212, and reverse polarity protection diode 214 are arranged in an electrically conductive manner as an additional circuit 216, connected in series, between signal connection 76 and ground connection 74 of signal module 8. Additional circuit 216 amplifies switch signal S, which is preferably conducted as a current signal, and allows a user to visually monitor the state of switch signal line 174 by means of display LED 212. In this exemplary embodiment, display LED 212 is green, for example, during operation and is off if switch signal line 174 is interrupted.

Figure 11:
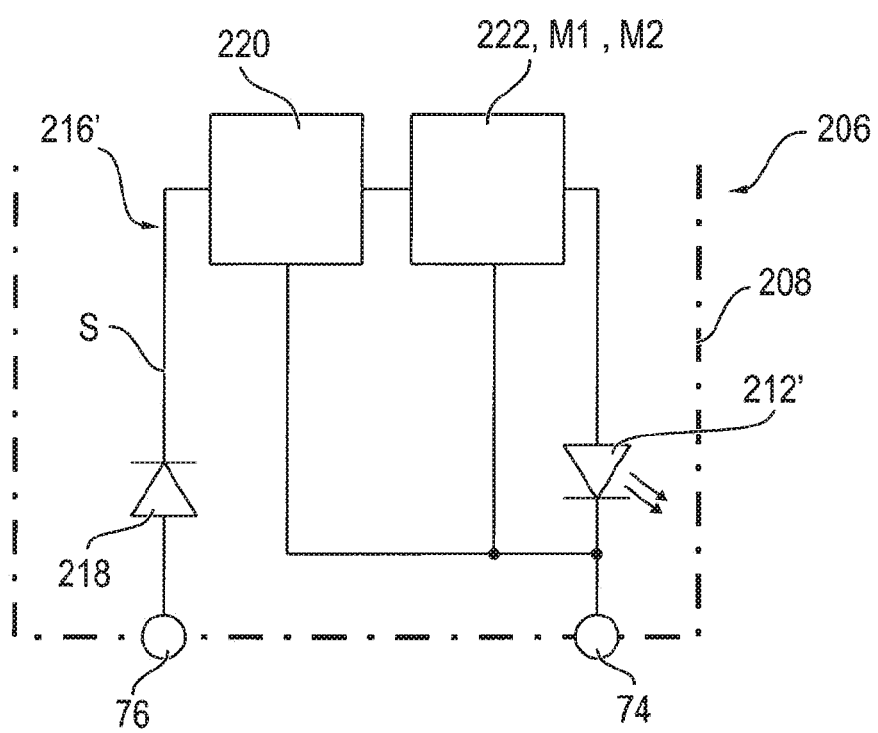
FIG. 11 shows a circuit diagram for a display module, which can be coupled to the signal module, in a second embodiment.

FIG. 11 shows a second embodiment variant of display module 206 with an active circuit. Additional circuit 216' which amplifies switch signal S has in this embodiment a protection diode 218, an internal power supply unit 220, an evaluation unit 222, and a display LED 212'. Protection diode 218 is disposed in the conducting direction between signal connection 76 and power supply unit 220. Power supply unit 220 and evaluation unit 222 are connected in parallel to display LED 212', which is designed as a double LED in this exemplary embodiment.

In a suitable embodiment, evaluation unit 222 is made as a microcontroller or alternatively by means of operational amplifiers, comparators, etc. In this exemplary embodiment, additional circuit 216' serves, in particular, as a switch signal monitoring module. The display LED or double LED 212', which is preferably green/red, is suitable and optically configured for displaying the four states OFF, green, yellow, and red, if necessary also flashing. As a result, an especially large amount of information can be displayed visually to a user via a switch signal circuit formed with switch signal line 174. Thus, for example, the three colors red/yellow/green are assigned to different operating states of the switch signal circuit, for example, green for a switch signal S with a measured value detected by evaluation unit 222 that is above a first threshold value M1 stored in the evaluation unit, yellow for a switch signal S that is between first threshold value M1 and a second threshold value M2, red for a switch signal S whose value is smaller than second threshold value M2, and OFF as a visual signal that there is no switch signal S or there is a voltage failure or a wire break in switch signal line 174.

In the case of suitable sizing for a voltage-type switch signal S, threshold value M1 is, for example, 22 V and threshold value M2 is 20 V. For a current-mode switch signal S, for example, a threshold value M1 of 10 mA and a threshold value M2 of 5 mA are conceivable.

In a suitable embodiment, the two-pole connecting terminals of load connections 126*a* and 126*b* each have a connection cross-section of approximately 4 mm$^2$. All connecting terminals of modules 4, 6, 8 are, for example, designed as screw terminals, resilient terminals, or preferably as spring force terminals, so that wire conductors or strand conductors can be connected in a vibration-free, maintenance-free manner and with a minimal mounting effort.

The invention is not limited to the exemplary embodiments described above. Rather, other variants of the invention can also be derived herefrom by the skilled artisan, without going beyond the subject of the invention. Particularly, further all individual features described in relation to the exemplary embodiments can also be combined with one another in a different manner, without going beyond the subject of the invention.

In particular, connection modules 6 are also conceivable for connection to a three-channel load circuit. For this purpose, additional connections are provided accordingly for the ground and return, as well as a three-part plug base contact of contact opening 102, with corresponding three load connections 126, for example, each with a 1.5 mm$^2$ flat connection cross section. Furthermore, it is possible, for example, to install display module 206 directly in housing 14 of signal module 8. Furthermore, different protective switches 24 can also be plugged in or mounted in individual connection modules 6.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

LIST OF REFERENCE CHARACTERS

2 Power distributor
4 Supply module
6 Connection module
8 Signal module
10 Housing
12 Housing
14 Housing
16 Housing back
18 Receptacle
20 Mounting rail
22 Row direction
24 Protective switch
26 End face
28 Front side
30 Top side
32 Bottom side
34 Supply connection
36 Coupling contact
38 Housing slot
40 Ground connection
42 Contact element/plug socket
44 Coupling contact
46 Housing opening
48 Housing slot
50 Return connection
52 Coupling contact
54 Housing slot
56 Signal connection
58 Communication/data bus connection
60 Communication/address bus connection
62 Contact element/plug socket
64 Contact element/plug socket
66 Contact element/plug socket
68 Housing opening
70 Housing opening
72 Housing opening
74 Ground connection
76 Signal connection
78 Communication/data bus connection
80 Communication/address bus connection
82 Contact element/plug
84 Contact element/plug
86 Contact element/plug
88 Contact element/plug
90 Coupling contact
92 Coupling contact
94 Coupling contact
96 Slot
98 Contact opening
100 Plug-in contact
102 Contact opening
102*a*, 102*b* Plug base partial contact
104, 104*a*, 104*b* Plug-in contact
106 Contact opening
108 Contact opening
110 Contact opening
112 Contact opening
114, 114*a*, 114*b* Contact opening
116 Signal contact
118 Signal contact
120 Signal/communication contact
122 Signal contact
124, 124*a*, 124*b* Signal/communication contact
126, 126*a*, 126*b* Load connection
128 Conductor rail
130 Ground connection
132 Ground connection
134 Return connection
136 Return connection
138 Contact element
138*a* Plug
138*b* Plug socket
140 Contact element
140*a* Plug
140*b* Plug socket
142 Contact element
142*a* Plug
142*b* Plug socket
144 Contact element
144*a* Plug
144*b* Plug socket
146 Housing opening
148 Housing opening
150 Housing opening
152 Housing opening
154 Latch tab
156 Latch receptacle
158 Joining extension
160 Joining receptacle
162 Conductor bar
164 Current bar
166 Current bar
168 Current bar
170 Cover element
172 Ground line
174 Switch signal line
176 Communication/data bus line
178 Communication/address bus line
180 Contact element
182 Contact element 184 Contact element
186 Contact element
188 Contact element
190 Spring bracket
192 Spring bracket
194 Spring bracket
196 Contacting bracket
198 Contacting bracket
200 Contacting bracket
202 Spring bracket
204 Contacting bracket
206 Display module
208 Housing
210 Series resistor
212 Display LED
212' Display LED/double LED
214 Reverse polarity protection diode
216, 216' Additional circuit
218 Protection diode
220 Power supply unit
222 Evaluation unit
S Switch signal
D Communication/data bus signal
A Communication/address bus signal
M1 Threshold value
M2 Threshold value

What is claimed is:

1. A power distributor comprising a plurality of power distribution modules, arranged in a row, for directly mounting on a mounting rail, the power distributor comprising:
a supply module arranged on an end face of the power distributor, the supply module having a supply connection for a main power line for tapping off a supply power;
a signal module arranged opposite the supply module;
at least one connection module arranged between the supply module and the signal module, the at least one connection module including a plurality of load connectors configured for wiring a multichannel load circuit; and
an actuatable protective switch configured to be fitted to the at least one connection module, the connection module having a plurality of load connections for connecting to a load circuit, the actuatable protective switch comprising a thermal circuit breaker, a thermal-magnetic circuit breaker, an electronic device circuit breaker, a switch relay or an overcurrent protection device,
wherein the actuatable protective switch is configured to interrupt the load circuit,
wherein the signal module has a first signal connection for a switch signal actuating the actuatable protective switch for interrupting the load circuit in an event of an overload,
wherein the plurality of power distribution modules is adapted to be coupled to each other in an electrically conductive manner,
wherein each of the supply module, the signal module and the at least one connection module comprise an individual housing having a groove disposed on a back on the housing such that the supply module, the signal module and the at least one connection module are configured to be individually, directly snapped onto the mounting rail, and
wherein the at least one connection module has a contact opening on a load output side for a plug-in contact of the actuatable protective switch, wherein the contact opening is configured as a multi-divided plug base contact, wherein plug base partial contacts formed thereby are galvanically separated from one another, and wherein each plug base partial contact is coupled to a separate load connection.

2. The power distributor according to claim 1, wherein the supply module and the at least one connection module comprise:
the supply connection for feeding in the supply power with a first coupling contact;
a ground connection with a second coupling contact; and
a return connection for returning the supply power with a third coupling contact,
wherein the first, second and third coupling contacts are arranged in a respectively associated housing slot on a housing front side, which slot passes completely through a housing of a respective module in a row direction.

3. The power distributor according to claim 1, further comprising:
a communication line formed by the plurality of power distribution modules for conducting a communication signal,
wherein the supply module has a first communication connection for supplying the communication signal,
wherein the at least one connection module is coupled in an electrically conductive manner to a communication contact of the actuatable protective switch,
wherein protective switches of a plurality of connection modules, arranged in a row, are connected in series with respect to the communication contact,
wherein the signal module has a second communication connection for tapping off the communication signal, and
wherein the plurality of power distribution modules is coupled in an electrically conductive manner on housing end faces of adjacent respective power distribution modules in the row direction via second contact elements.

4. The power distributor according to claim 3, wherein the actuatable protective switch is configured to be actuated remotely via the communication line.

5. The power distributor according to claim 1, further comprising:
a display module for a visual monitoring of the switch signal line connected to the signal module.

6. The power distributor according to claim 5, wherein the display module has a display LED and an additional circuit that amplifies the switch signal.

7. The power distributor according to claim 6, wherein the additional circuit has an internal power supply unit as a voltage supply and an electronic evaluation unit, and wherein the display LED is a double LED.

8. The power distributor according to claim 7, wherein the display module is configured to change a color of the display LED based on the switch signal detected by the electronic evaluation unit.

9. The power distributor according to claim 6, wherein the display module is configured to turn off the display LED when an interruption of the switch signal line occurs.

10. The power distributor according to claim 6, further comprising an internal power supply unit having a separate power supply for the display LED.

11. A protective switch for fitting the power distributor according to claim 1, comprising:
a control unit for actuating a switching element as a function of the switch signal;

two plug-in contacts for connecting to the main power line and to the load circuit;
two signal contacts for connecting to the switch signal line; and
at least one communication contact for connecting to a communication line.

12. The power distributor according to claim 1, wherein the protective switch comprises:
a switching element; and
an internal control unit configured to actuate the switching element as a function of a switch signal.

13. The power distributer according to claim 1, wherein the protective switch comprises two signal contacts configured to connect the protective switch to slots in the at least one connection module.

14. The power distributer according to claim 1, wherein the at least one connection module comprises a latch tab for engaging a latch receptacle on an adjacent connection module.

15. A power distributor comprising a plurality of power distribution modules, arranged in a row, for directly mounting on a mounting rail, the power distributor comprising:
a supply module arranged on an end face of the power distributor, the supply module having a supply connection for a main power line for tapping off a supply power;
a signal module arranged opposite the supply module;
at least one connection module arranged between the supply module and the signal module;
an actuatable protective switch configured to be fitted to the at least one connection module, the connection module having a plurality of load connections for connecting to a load circuit, the actuatable protective switch comprising a thermal circuit breaker, a thermal-magnetic circuit breaker, an electronic device circuit breaker, a switch relay or an overcurrent protection device; and
a switch signal line formed by the plurality of power distribution modules for conducting the switch signal,
wherein the actuatable protective switch is configured to interrupt the load circuit,
wherein the signal module has a first signal connection for a switch signal actuating the actuatable protective switch for interrupting the load circuit in an event of an overload,
wherein the plurality of power distribution modules is adapted to be coupled to each other in an electrically conductive manner,
wherein the supply module has a second signal connection for supplying the switch signal,
wherein the at least one connection module is coupled in an electrically conductive manner to two signal contacts of the actuatable protective switch,
wherein protective switches of a plurality of connection modules, arranged in a row, are connected in series with respect to the two signal contacts,
wherein the switch signal is adapted to be tapped off at the first signal connection of the signal module,
wherein the plurality of power distribution modules is coupled in an electrically conductive manner in the row direction via first contact elements on housing end faces of adjacent respective power distribution modules,
wherein each of the supply module, the signal module and the at least one connection module comprise an individual housing having a groove disposed on a back on the housing such that the supply module, the signal module and the at least one connection module are configured to be individually, directly snapped onto the mounting rail, and
wherein each of the first contact elements have a spring bracket contact that protrudes from each housing of the plurality of power distribution modules on a respective housing end face, and, in a mounted state, engages at least partially in an adjacent housing and couples in an electrically conductive manner with a contacting bracket of an adjacent contact element.

16. A power distributor comprising:
a mounting rail;
a plurality of power distribution modules arranged in a row on the mounting rail, the plurality of power distribution modules comprising:
a supply module arranged on an end face of the power distributor, the supply module having a supply connection for a main power line for tapping off a supply power;
a signal module arranged opposite the supply module;
a connection module, having a plurality of load connections for connecting to a load circuit, arranged between the supply module and the signal module; and
a protective switch configured to be coupled to the connection module, the actuatable protective switch comprising a thermal circuit breaker, a thermal-magnetic circuit breaker, an electronic device circuit breaker, a switch relay or an overcurrent protection device,
wherein the signal module has a first signal connection configured to receive a switch signal to actuate the protective switch for interrupting the load circuit in an event of an overload,
wherein each of the supply module, the signal module and the at least one connection module comprise an individual housing having a groove disposed on a back on the housing such that the supply module, the signal module and the at least one connection module are configured to be individually, directly snapped onto the mounting rail, and
wherein the connection module has a contact opening on a load output side for a plug-in contact of the protective switch, wherein the contact opening is configured as a multi-divided plug base contact, wherein plug base partial contacts formed thereby are galvanically separated from one another, and wherein each plug base partial contact is coupled to a separate load connection.

* * * * *